United States Patent
Mauder et al.

(10) Patent No.: US 10,042,002 B2
(45) Date of Patent: Aug. 7, 2018

(54) SYSTEM AND METHOD FOR CONTACT MEASUREMENT CIRCUIT

(71) Applicant: Infineon Technologies Austria AG, Villach (AT)

(72) Inventors: Anton Mauder, Kolbermoor (DE); Jens Barrenscheen, Munich (DE)

(73) Assignee: INFINEON TECHNOLOGIES AUSTRIA AG, Villach (DE)

(*) Notice: Subject to any disclaimer, the term of this patent is extended or adjusted under 35 U.S.C. 154(b) by 0 days.

(21) Appl. No.: 14/569,418

(22) Filed: Dec. 12, 2014

(65) Prior Publication Data
US 2016/0169945 A1 Jun. 16, 2016

(51) Int. Cl.
*G01R 31/327* (2006.01)
*G01R 27/20* (2006.01)
*H01H 1/00* (2006.01)

(52) U.S. Cl.
CPC ....... *G01R 31/3274* (2013.01); *G01R 27/205* (2013.01); *H01H 1/0015* (2013.01)

(58) Field of Classification Search
None
See application file for complete search history.

(56) References Cited

U.S. PATENT DOCUMENTS

| 4,104,578 | A | * | 8/1978 | Thuot | G01R 31/3274 324/140 R |
|---|---|---|---|---|---|
| 6,407,534 | B1 | * | 6/2002 | Mukainakano | G01R 31/3606 320/162 |
| 7,557,583 | B2 | * | 7/2009 | Zettel | H01H 47/002 324/418 |
| 2004/0047097 | A1 | * | 3/2004 | Jordan | G01R 31/3278 361/92 |
| 2004/0189307 | A1 | * | 9/2004 | Rudholm | G01R 31/3274 324/421 |
| 2015/0054517 | A1 | * | 2/2015 | Yonezaki | H01H 47/002 324/418 |

FOREIGN PATENT DOCUMENTS

| CN | 101793933 A | | 8/2010 |
|---|---|---|---|
| CN | 102074398 A | | 5/2011 |
| CN | 103926466 A | | 7/2014 |
| JP | 2001238431 A | * | 8/2001 |
| JP | 2009239535 A | * | 10/2009 |

\* cited by examiner

Primary Examiner — Paresh Patel
(74) Attorney, Agent, or Firm — Slater Matsil, LLP

(57) ABSTRACT

According to an embodiment, a contact measurement circuit is configured to be coupled between a first contact and a second contact, and the contact measurement circuit includes a first transistor, a control capacitor, and a voltage measurement unit. The first transistor includes a first conduction terminal configured to be coupled to the first contact, a second conduction terminal, and a first control terminal. The control capacitor includes a first capacitor terminal coupled to the second conduction terminal and a second capacitor terminal coupled to the first control terminal. The voltage measurement unit is coupled to the first capacitor terminal and the second capacitor terminal, and the second capacitor terminal is configured to be coupled to the second contact.

30 Claims, 11 Drawing Sheets

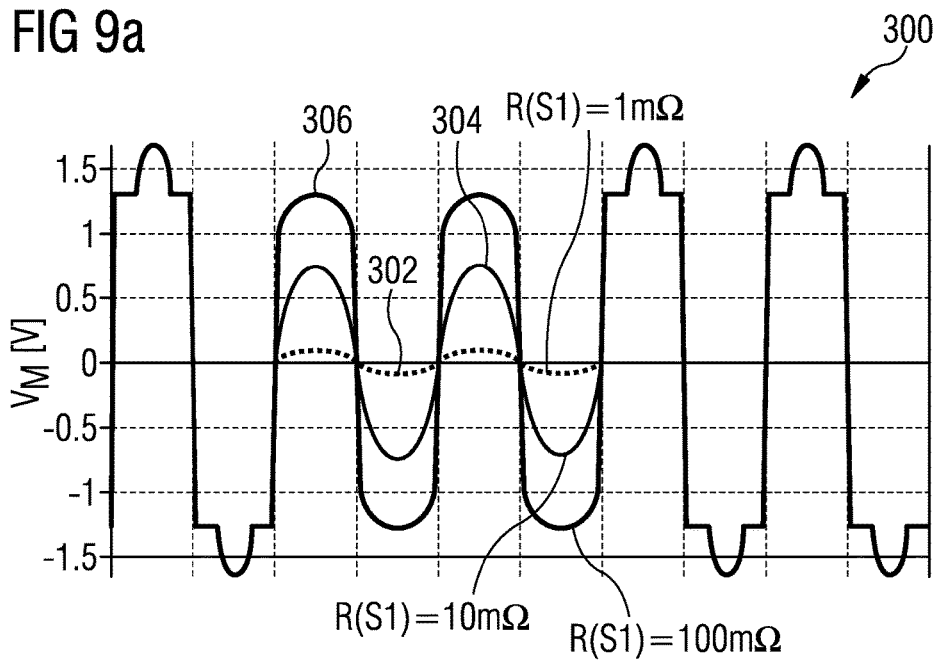
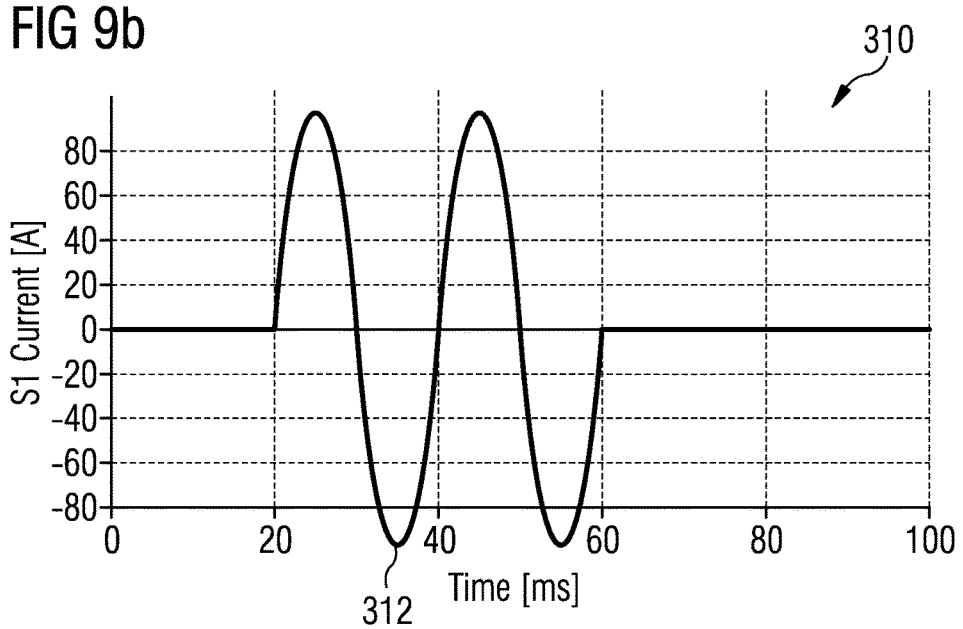

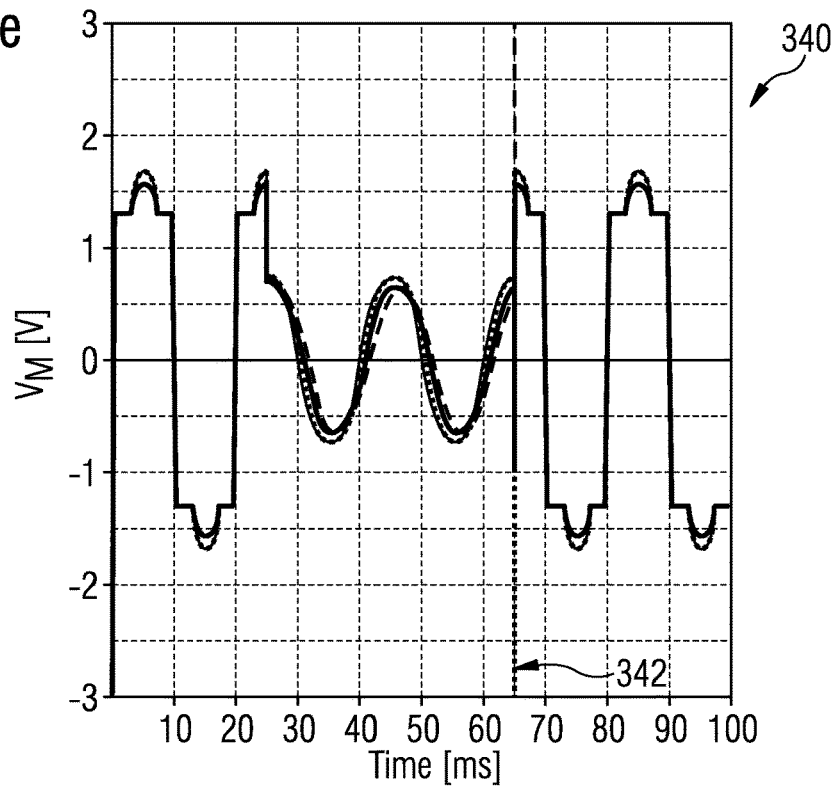
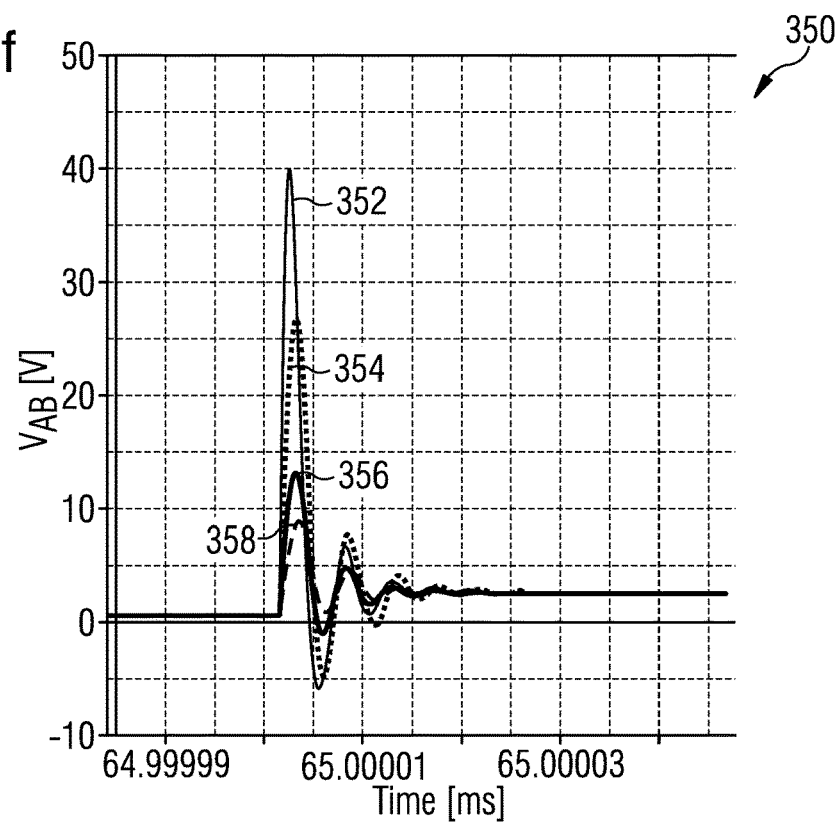

SYSTEM AND METHOD FOR CONTACT MEASUREMENT CIRCUIT

TECHNICAL FIELD

The present invention relates generally to electronic circuits, and, in particular embodiments, to a system and method for a contact measurement circuit.

BACKGROUND

Electrical circuits are pervasive in technology, existing as both an enabling driver of technological innovation and a subject of innumerable innovations past and present. Generally, electrical circuits include known elements and are understood according to known laws. For example, circuit elements often include resistors, capacitors, inductors, transistors, diodes, transformers, batteries, and relays, to name a few. Further, these circuits can usually be understood, at least partially, using Ohm's law, Kirchhoff's laws, and various other circuit tricks. Along these lines, one of the relevant properties of most circuit elements is electrical impedance or, in a simplified case, resistance, as shown in the simplified Ohm's law, $$V = I \cdot R$$

where V is the voltage, R is the resistance, and I is the electrical current. Here, in the most basic tenet of circuit operation, the resistance R determines the interplay of voltage and current.

Thus, understanding the resistance of electrical elements is often useful to the operation of electrical circuits. For example, as higher voltages are applied to electrical elements, the power dissipated in the electrical element may increase significantly with a higher resistance. Further, as resistance and power dissipation increase, additional heat is produced in the electrical element. If too much heat is produced, it is possible that the electrical circuit will fail in some way, such as, e.g., melting, fire, or malfunction. Thus, the resistance of electrical elements has an effect on electrical circuits and, thereby, on the technology using these circuits, from automobiles to computers, for example.

As a further illustration, resistance is often relevant at an interface. In some instances, resistance at an interface is called contact resistance. Again, contact resistance is relevant in numerous electrical circuits at multiple scales, both large and small. For example, electrical contacts are used to interface with semiconductor dies at the, e.g., micrometer (μm) scale and are also used in mechanical relays that may conduct or block currents from an, e.g., 1000 Volt source. In either the small or large scale, electrical contacts can be responsible for either failure or improved operation in different cases. Thus, understanding contact resistance is a relevant target for innovative solutions.

SUMMARY

According to an embodiment, a contact measurement circuit is configured to be coupled between a first contact and a second contact, and the contact measurement circuit includes a first transistor, a control capacitor, and a voltage measurement unit. The first transistor includes a first conduction terminal configured to be coupled to the first contact, a second conduction terminal, and a first control terminal. The control capacitor includes a first capacitor terminal coupled to the second conduction terminal and a second capacitor terminal coupled to the first control terminal. The voltage measurement unit is coupled to the first capacitor terminal and the second capacitor terminal, and the second capacitor terminal is configured to be coupled to the second contact.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9a, 9b, 9c, 9d, 9e, and 9f illustrate current and voltage waveform diagrams of embodiment measurement circuits in simulated operation.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely measurement circuits, and more particularly, contact measurement circuits for mechanical contacts. Some of the various embodiments described herein include contact measurement circuits coupled to mechanical relays in high voltage applications, such as automobile applications, for example. In other embodiments, aspects may also be applied to other applications involving any type of measurement circuit according to any fashion as known in the art.

According to various embodiments, a self-protecting automatic measurement circuit monitors the contact resistance at the coupling of an electrical element. For example, electrical elements with relevant contact resistances may include mechanical relays, electrical fuses, electric switches, and contact plugs, to name a few.

Figure 1:
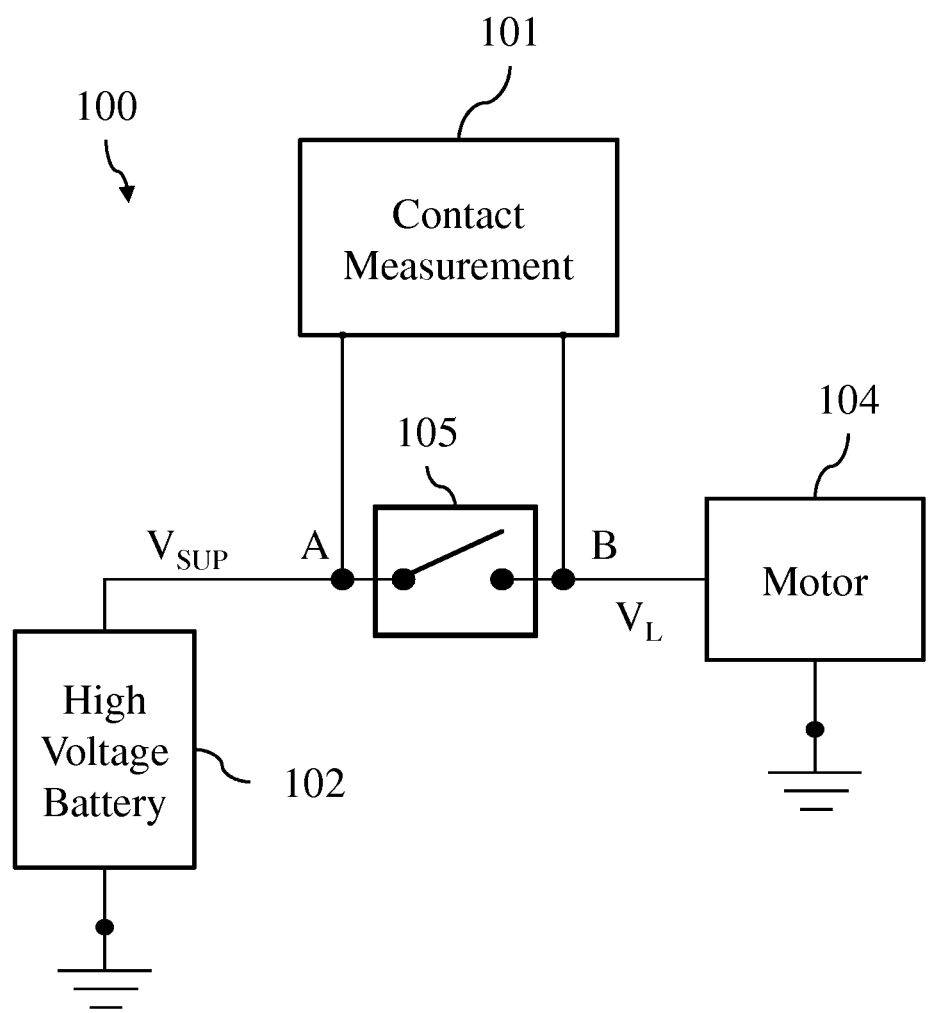
FIG. 1 illustrates a system block diagram of an embodiment relay system.

FIG. 1 illustrates a system block diagram of an embodiment relay system 100 according to a specific example embodiment. In this specific example embodiment, relay system 100 includes a mechanical relay 105 coupled between a voltage source, depicted as high voltage battery 102, and a load, depicted as electric motor 104 for an automobile. During operation, mechanical relay 105 connects high voltage battery 102, which may generate a supply voltage VSUP of between, e.g., 400 V and 800 V, to electric motor 104 and may conduct a current on the order of 10 or 100 amperes.

In such an embodiment, mechanical relay 105 has a resistance $R_{relay}$ that is approximately equal to the contact resistance $R_{AB}$ of mechanical relay 105 between nodes A and B. In an ideal situation, contact resistance $R_{AB}$ is zero. In practical applications, resistance $R_{relay} \approx R_{AB}$ may be on the order of milliohms (mΩ) or microohms (μΩ). Contact resistance $R_{AB}$ may be decreased according to various techniques, such as adjusting contact chemistries and increasing contact size, which may lead to increased cost. However, over time the usage of mechanical relay 105 may cause wear of the contacts, which degrades the contacts, and oxides or other substances may also accumulate such that performance is reduced and contact resistance $R_{AB}$ is increased.

As an example, if contact resistance $R_{AB}$ increases to 1Ω over time through wear, a 40 A current flowing through the relay would dissipate 1600 Watts according to the power equation $$P = I^2 \cdot R,$$

where P is power dissipated, I is current, and R is resistance, which results in the calculation (40 A)²·(1Ω)=1600 W. In such cases, 1600 W would be dissipated in mechanical relay 105, which may cause excessive heat and system destruction and may be a source of inefficiency in the system. Thus, according to various embodiments, contact measurement circuit 101 measures contact resistance $R_{AB}$ between nodes A and B in order to monitor the contact resistance and prevent failure or degraded performance. In some embodiments, contact measurement circuit 101 is self-protecting and automatic, requiring no control signals from an external or additional controller. In a particular embodiment, contact measurement circuit 101 is self-adapting through the operations of a normally-on depletion device, as is described herein below in reference to transistors 108 and 109. As discussed above, relay system 100 is an example embodiment referring specifically to an electric motor, high voltage battery, and a mechanical relay. In other embodiments, embodiment contact measurement circuits may be included in any type of circuit or system with any type of switch or electrical element, such as mechanical relays, mechanical switches, electrical fuses, electric switches (mechanical or electronic), and contact plugs, to name a few.

Figure 2:
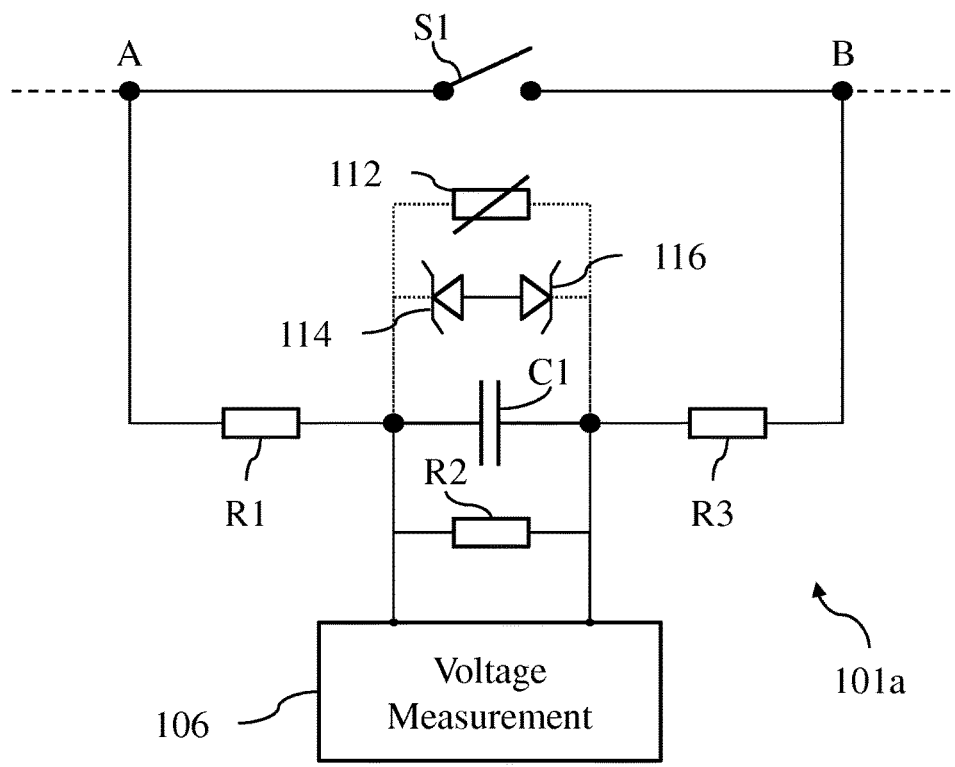
FIG. 2 illustrates a schematic of a possible contact measurement circuit.

FIG. 2 illustrates a schematic of a contact measurement circuit 101a coupled across switch S1, and including measurement capacitor C1, voltage measurement unit 106, and a resistive divider circuit with resistors R1, R2, and R3 coupled between nodes A and B. Contact measurement circuit 101a may also include a voltage limiting element coupled in parallel with measurement capacitor C1, such as Zener diodes 114 and 116 or varistor 112.

Contact measurement circuit 101a measures a voltage across measurement capacitor C1 and resistor R2 that is proportionally related to a voltage across switch S1 which is coupled between nodes A and B. The voltage across switch S1 is indicative of the resistance in switch S1, including contact resistance R between nodes A and B, because the voltage increases proportionally to the resistance based on Ohm's law. In this possible configuration, the resistive divider circuit with resistors R1, R2, and R3 in the case of high voltage operation may limit voltage measurement unit 106 from effectively determining the voltage across switch S1 because resistors R1 and R3 are may be very large in high voltage configurations, such as between 500 kΩ and 50 MΩ, in order to protect voltage measurement unit 106 from large voltages, such as between 400 V and 1500 V, and to prevent large currents in contact measurement circuit 101a between nodes A and B when switch S1 is open. Voltage measurement unit 106 may have an operating range from 100 mV to 300 mV and may include a voltage tolerance of up to 3 V, for example. In other applications, voltage measurement unit 106 may have an operating range below 100 mV or above 300 mV and may include a voltage tolerance above 3 V. In such cases as depicted in FIG. 2 where resistors R1 and R3 are large, it may be difficult to determine a millivolt level voltage drop between nodes A and B using voltage measurement unit 106 coupled across measurement capacitor C1 and R2.

Figure 3:
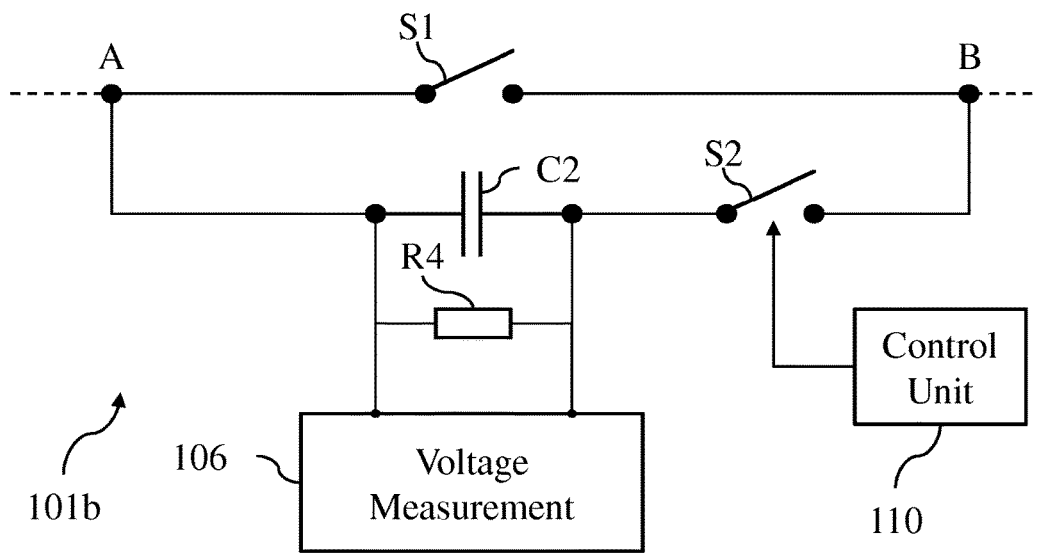
FIG. 3 illustrates a schematic of another possible contact measurement circuit.

In order to provide full DC blocking and decrease the size of resistors in a measurement circuit, an additional switch may be incorporated into the measurement circuit current path between nodes A and B. FIG. 3 illustrates a schematic of another contact measurement circuit 101b including switch S2 coupled in series with measurement capacitor C2 and measurement resistor R4 between nodes A and B. Measurement capacitor C2 and measurement resistor R4 are coupled in parallel and voltage measurement unit 106 is coupled to the parallel combination of C2 and R4 and configured to measure the voltage across the parallel combination of C2 and R4. When switches S1 and S2 are closed, voltage measurement unit 106 directly measures the voltage across switch S1, which may be on the order of millivolts or volts depending on the resistance, including the contact resistance, of switch S1. When switch S1 is open, switch S2 must also be controlled by control unit 110 to be opened as well. If switch S1 is open and switch S2 is not opened, voltage measurement unit 106 may be destroyed if a moderate or large voltage is applied at node A. In various embodiments, switch S1 is closed prior to closing switch S2 and switch S2 is opened prior to opening switch S1 in order to prevent damage or destruction of voltage measurement unit 106. In case of a failure of switch S1 or switch S2 caused by a timing error, for example, damage or destruction of voltage measurement unit 106 may occur.

Contact measurement circuit 101b allows for the removal of resistors R1 and R3 for large voltages and offers improved measurements of the voltage across switch S1 when switch S1 is closed. In such cases as depicted in FIG. 3, the introduction of a control unit 110 and switch S2 may increase cost and operational complexity. As mentioned above, if control unit 110 and switch S2 malfunction, it may be possible for voltage measurement unit 106 to be destroyed. Thus, operation of control unit 110 may require additional testing or redundancy, which may lead to increased complexity.

Figure 4:
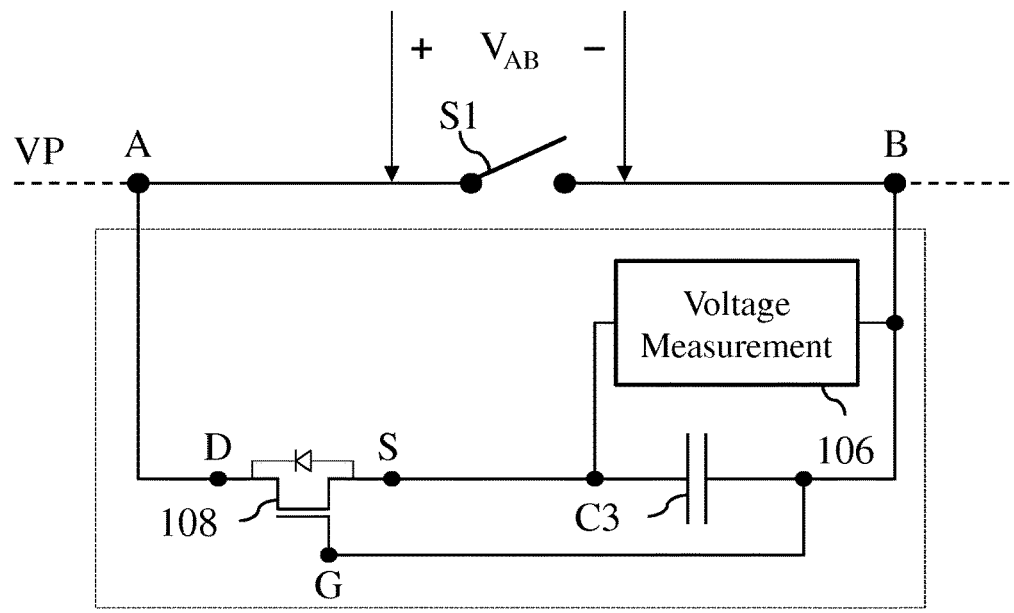
FIG. 4 illustrates a schematic of an embodiment contact measurement circuit.

FIG. 4 illustrates a schematic of an embodiment contact measurement circuit 101c including transistor 108 coupled in series with control capacitor C3 across switch S1, which is coupled between nodes A and B. Voltage measurement unit 106 is coupled across terminals of control capacitor C3. According to various embodiments, contact measurement circuit 101c is supplied by positive voltage VP at node A and coupled to a load through node B. In various embodiments, contact measurement circuit 101c is controlled automatically by voltages at nodes A and B and the influence of control capacitor C3 to enter the on-state and the off-state. In such embodiments, contact measurement circuit 101c is self-protecting and provides DC blocking with transistor 108 between nodes A and B when switch S1 is open and positive voltage VP is supplied to node A. Thus, contact measurement circuit 101c may exhibit controlled switching without any control signal or external control circuit. In some specific embodiments, contact measurement circuit 101c only includes non-switching impedance elements for controlling transistor 108.

In various embodiments, transistor 108 enters a conducting state, an on-state, when switch S1 is closed and voltage drop VAB across switch S1 is small. In a specific embodiment, transistor 108 is in a conducting state when voltage drop VAB is less than the threshold voltage of transistor 108. Transistor 108 enters a blocking state when voltage drop VAB is greater than the threshold voltage of transistor 108, such as when switch S1 is open and blocking positive voltage VP, causing voltage drop VAB to increase. In some embodiments, voltage polarity and device types may be switched. In various embodiments, when the magnitude of voltage drop VAB is greater than the magnitude of the threshold voltage of transistor 108, transistor 108 may enter a blocking state.

In various embodiments, transistor 108 is a normally-on transistor, such as a depletion-mode transistor. In such embodiments, the drain of transistor 108 is coupled to node A, the source of transistor is coupled to a first terminal of control capacitor C3, and the gate of transistor 108 is coupled to a second terminal of control transistor C3. When switch S1 is closed and voltage drop VAB is small, or near zero, transistor 108 also has a small voltage, or near zero voltage, applied across the gate and source, which causes transistor 108 to enter a conducting state and allows voltage drop VAB to be sampled by control capacitor C3. When switch S1 is opened, the voltage at node B drops compared to the voltage at node A. Voltage drop VAB is applied as −VAB across the gate and source of transistor 108 such that transistor 108 is turned off, or enters a non-conducting state, when voltage drop VAB is larger in magnitude than the threshold voltage, i.e., VGS of transistor 108. Thus, according to various embodiments, contact measurement circuit 101c is able to measure small voltages across switch S1, such as when switch S1 is closed, and is also able to provide DC blocking for large voltages across switch S1, such as when switch S1 is open. In such embodiments, because of the described operation, contact measurement circuit 101c may be referred to as an automatic self-protecting measurement circuit that provides DC blocking without a controller or external control inputs. In particular embodiments, contact measurement circuit 101c is self-protecting or self-adapting through the operation of transistor 108, which is a normally-on depletion device.

In some embodiments, positive voltage VP is a high voltage. In a specific embodiment, positive voltage VP is greater than 100 V. In another embodiment, positive voltage VP is greater than 400 V. According to further specific embodiments, transistor 108 is a high voltage depletion transistor. Transistor 108 may be a high voltage vertical power device that is normally on. In some specific embodiments, transistor 108 has a negative gate-source voltage threshold of between −0.6 V and −3 V. In other embodiments, transistor 108 has a gate-source voltage threshold outside of this range.

In various embodiments, voltage measurement unit 106 may include various types of voltage measurement elements. For example, voltage measurement unit 106 may include an analog to digital converter (ADC). In one embodiment, voltage measurement unit 106 is a sigma-delta ADC. An advantage of a sigma-delta ADC may include high accuracy conversion results with a simple interface.

Figure 5:
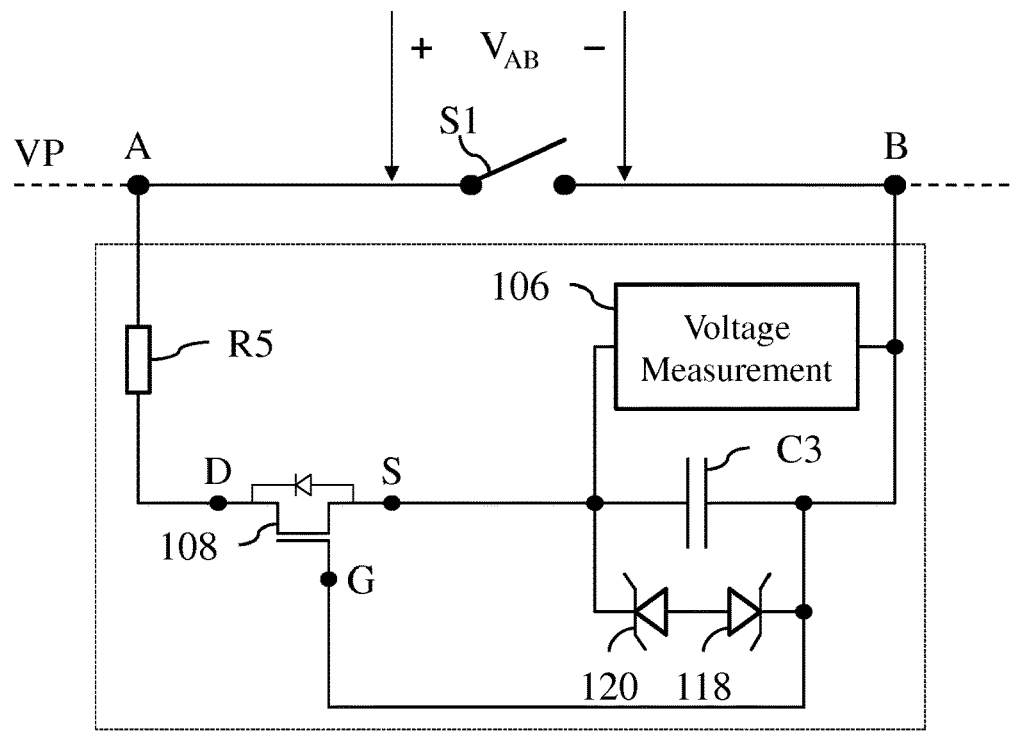
FIG. 5 illustrates a schematic of another embodiment contact measurement circuit.

FIG. 5 illustrates a schematic of another embodiment contact measurement circuit 101d including transistor 108, control capacitor C3, voltage measurement unit 106, resistor R5, and a voltage limiting element such as, e.g., Zener diodes 118 and 120. According to various embodiments, contact measurement circuit 101d may operate in a similar manner as described above in reference to contact measurement circuit 101c in FIG. 4. Thus, the description of similar elements in reference to FIG. 4 also applies to similarly numbered elements in FIG. 5, and the description is not repeated herein for the sake of brevity.

In various embodiments, resistor R5 and Zener diodes 118 and 120 are additionally included in contact measurement circuit 101d compared to contact measurement circuit 101c. Resistor R5 may influence or alter the RC time constant of contact measurement circuit 101d and also may provide protection of the other elements in contact measurement circuit 101d from current spikes or other errors.

Zener diodes 118 and 120 may limit the voltage across control capacitor C3. In some embodiments, control capacitor C3 may slowly charge to a higher voltage than the threshold voltage of transistor 108 due to the leakage current of transistor 108 when voltage drop VAB is large, such as when switch S1 is open. Voltage measurement unit 106 may be damaged if the voltage across control capacitor C3 exceeds a safe operating voltage for voltage measurement unit 106. In some embodiments, Zener diodes 118 and 120 may be selected to limit the voltage across control capacitor C3 to be below the safe operating voltage of voltage measurement unit 106. For example, the safe operating voltage of voltage measurement unit 106 may be 3 V and Zener diodes 118 and 120 are configured to conduct a current when a voltage of 2 V is applied across Zener diodes 118 and 120. In various other embodiments, Zener diodes 118 and 120 may be implemented as other types of voltage limiting elements, such as regular diodes or varistors, for example.

Figure 6:
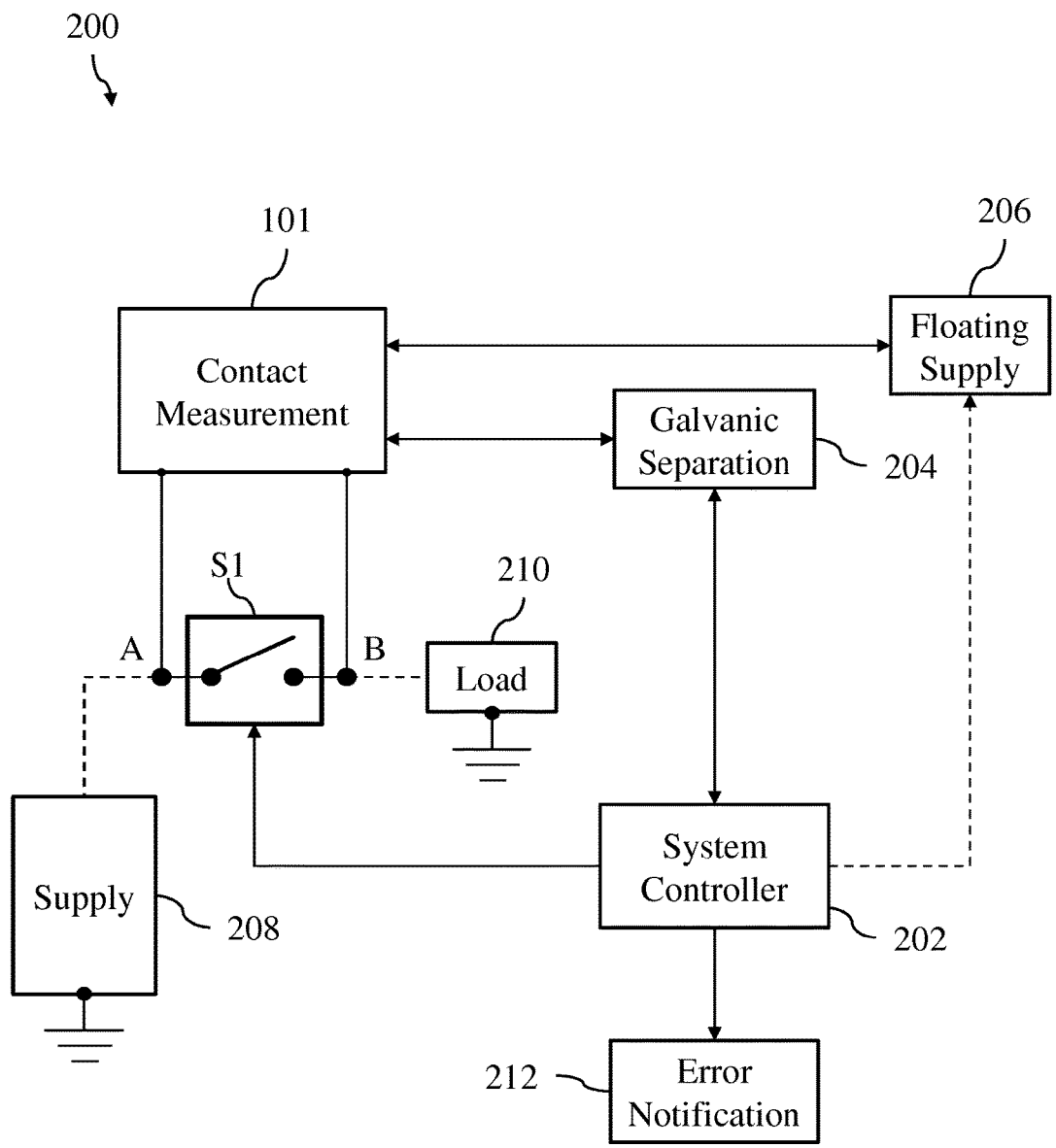
FIG. 6 illustrates a system block diagram of an embodiment contact measurement system.

FIG. 6 illustrates a system block diagram of an embodiment contact measurement system 200 including contact measurement circuit 101, switch S1, system controller 202, galvanic separation element 204, and floating supply 206. According to various embodiments, switch S1 may be coupled between voltage supply 208, which supplies either alternating or direct current (AC or DC), and load element 210. Contact measurement circuit 101 may include any of the contact measurement circuits described herein and operates to determine and monitor contact resistance R between nodes A and B for switch S1 as described above. In particular embodiments, contact measurement circuit 101 may include contact measurement circuit 101c, 101d, or 101e as described herein.

In various embodiments, system controller 202 provides control signals to switch S1 in order to regulate the switching of switch S1, and system controller 202 communicates through galvanic separation element 204 with contact measurement circuit 101 to receive voltage measurements. Based on the voltage measurements received from contact measurement circuit 101 through galvanic separation element 204, system controller 202 determines the contact resistance $R_{AB}$ between nodes A and B. If contact resistance $R_{AB}$ rises above an error threshold, the system controller may notify the user through error notification unit 212. For example, error notification unit 212 may illuminate a warning light visible to the driver in the case of a mechanical relay for an automobile. In other embodiments where switch S1 is a mechanical relay, system controller 202 may initiate a repair sequence to open and close switch S1 under a high voltage in order to cause electric arcing to clear material from the contacts and decrease the contact resistance.

System controller 202 may use the result of the contact measurement for plausibility checks of other system components. In one embodiment a current sensor (not shown) located between voltage supply 208, which may be a high-voltage supply, and load element 210 delivers a signal indicating the load current. The voltage measured across switch S1 also contains information about the actual current through switch S1, which is equal to the load current. In some embodiments, these two measured values may be compared in order to determine if one of the two measurements is wrong. For example, if the current sensor delivers a result indicating zero current and contact measurement circuit 101 delivers a value that is still in the measurement range for the contact measurement but not close to zero, the system controller may identify improper operation or an error condition for the current sensor.

In some embodiments, if switch S1 is a mechanical switch or a mechanical relay, closing the switch contact may cause scattering or contact bouncing to occur. During this time, the contact measurement may not exhibit the low voltage of a closed contact in static operation. Therefore, system controller 202 may enable contact verification through voltage measurements after a set delay time subsequent to closing the switch S1. Contact scattering is also influenced by parameters controlling a mechanical relay such as, e.g., the supply current through a coil driving the contacts or the internal structure of a relay such as, e.g., the stiffness of springs providing a contact. A change in the control of the mechanical relay or in the internal structure of the mechanical relay may lead to longer contact scattering. When contact scattering lasts longer than the initial established or set delay time, system controller 202 may identify continued contact scattering and may notify the user through error notification unit 212.

Contact measurement circuit 101 includes a voltage measurement unit, as described herein in reference to FIGS. 2-5 and 7. In various embodiments, the voltage measurement unit may be implemented as an ADC, a sigma-delta ADC, or a comparator for comparing the voltage drop VAB across terminals A and B with a threshold value or an analog voltage measurement, for example. Depending on the type of voltage measurement unit, the communication channel between system controller 202 and the voltage measurement unit in contact measurement circuit 101 may include various types of signals. In an embodiment, a sigma-delta ADC will receive a sigma-delta clock signal from system controller 202 (through galvanic separation element 204) and will communicate information with a sigma-delta data signal (again, through galvanic separation element 204). In other embodiments, further configurations of signals, including more or less signals, may be used to communicate between the voltage measurement unit and the system controller 202.

In various embodiments, system controller 202 may be a microcontroller, an application specific integrated circuit (ASIC), or assembled discrete digital or analog components. Galvanic separation element 204 may be implemented as an inductive, capacitive, or optical isolation element. In particular embodiments, galvanic separation element 204 is implemented as an optocoupler or a transformer. Switch S1 may be a mechanical or solid-state relay, a fuse, or an electric switch. In further embodiments, contact measurement system 200 may be arranged for any type of contact measurement including measuring non-switching elements such as contact plugs, for example. In various embodiments, floating supply 206 may be implemented as a floating power supply including a transformer. In other embodiments, alternative known approaches may be applied to implement a floating power supply.

FIG. 7 illustrates a schematic of a further embodiment contact measurement circuit 101e that is attached across switch S1 and includes transistor 108, transistor 109, control capacitor C3, resistors R6 and R7, and diodes 122a, 122b, 122c, 124a, 124b, and 124c. Voltage source 126 supplies node A and load 128 is coupled to load B. According to various embodiments, voltage source 126 may be an AC voltage source and load 128 is modeled by inductor LL and resistor RL. The operation of contact measurement circuit 101e is similar to the operation of the contact measurement circuits described in reference to FIGS. 4 and 5 with the addition that transistor 109 causes contact measurement circuit 101e to provide bipolar operation and blocking. In such embodiments, voltages of either polarity may be applied between nodes A and B and contact measurement circuit 101e operates to measure voltage drop VAB or provide DC blocking between nodes A and B. In other embodiments, voltage source 126 may also be a DC voltage source.

In various embodiments, transistors 108 and 109 operate to enter an on-state, or a conducting state, when voltage drop VAB is less in magnitude than a threshold voltage and to enter an off-state, or a non-conducting state, when voltage drop VAB is greater in magnitude than the threshold voltage. In some embodiments, the threshold voltage is the threshold voltage of transistors 108 and 109. In specific embodiments, transistors are normally-on depletion field effect transistors (FETs) and the threshold voltage is the gate-source voltage VGS of the transistor. In a still more specific embodiment, transistors 108 and 109 are each implemented as a high voltage depletion FET.

According to various embodiments, when voltage drop VAB is less in magnitude than the threshold voltage, such as when switch S1 is closed, transistors 108 and 109 are both in the on-state and measurement voltage VM across control capacitor C3 is equal to voltage drop VAB across switch S1. When voltage drop VAB is greater in magnitude than the threshold voltage, such as when switch S1 is opened, one of transistors 108 and 109 is in the off-state and measurement voltage VM may be limited to the threshold voltage. In such embodiments, measurement voltage VM on control capacitor C3 may follow voltage drop VAB until reaching the threshold voltage in magnitude. In a specific embodiment, when voltage drop VAB is greater in magnitude, with either polarity, than the gate-source threshold voltage VGS of transistors 108 and 109, one of transistors 108 and 109 will be in the off-state, or non-conducting. For example, when voltage drop VAB is positive (from left to right across switch S1 as shown) and greater than gate-source threshold voltage VGS of transistors 108 and 109, transistor 108 will be in the off-state because the gate-source voltage applied to transistor 108 is negative magnitude −‖VAB‖ while the gate-source voltage applied to transistor 109 is positive magnitude +‖VAB‖. On the other hand, when voltage drop VAB is negative (opposite as shown) and greater than gate-source threshold voltage VGS of transistors 108 and 109, transistor 109 will be in the off-state because the gate-source voltage applied to transistor 109 is negative magnitude −‖VAB‖ while the gate-source voltage applied to transistor 108 is positive magnitude +‖VAB‖.

In various embodiments, sigma-delta ADC 107 measures and monitors measurement voltage VM across control capacitor C3, which may correspond to voltage drop VAB when switch S1 is closed, and transmits measurement voltage VM through data signal line DATA based on clock signal line CLK. In some embodiments, sigma-delta ADC receives power through floating voltage supply 130. In alternative embodiments, sigma-delta ADC 107 may be implemented as any type of voltage measurement circuit, such as other types of ADCs for example.

In some embodiments, as described in reference to FIG. 6, based on measurement voltage VM, system controller 202 (not shown) may determine if switch S1 is opened or closed and also may identify error conditions. Based on the error condition, system controller 202 may signal an error notification or perform a repair sequence as described above in reference to FIG. 6.

In some embodiments, there is a time response of control capacitor C3, resistor R6, and resistor R7 when switch S1 is opened or closed, or, e.g., during high voltage spikes when the switch S1 is closed causing short transients in voltage drop VAB. Accordingly, when switch S1 is opened or closed, there is a certain time period, set by the RC time constant of R6, R7, and C3, during which the voltage on capacitor C3 is quickly changing before transistors 108 and 109 are either switched into the on-state (when switch S1 is closed) or the off-state (when switch S1 is opened). In some embodiments, the RC time constant is set by R6, R7, and C3 in order to filter the operation of contact measurement circuit 101e. In a specific embodiment, resistors R6 and R7 and control capacitor C3 are configured as a low pass filter (LPF).

According to various embodiments, diodes 122a, 122b, 122c, 124a, 124b, and 124c prevent damage to sigma-delta ADC 107 caused by charge accumulation on control capacitor C3 when switch S1 is opened and contact measurement circuit 101e is blocking supply voltage VSUP. In such embodiments, transistors 108 and 109 may allow some leakage current that will accumulate in control capacitor C3, which functions as an integrator in such cases. Thus, it may be possible that measurement voltage VM across control capacitor C3 increases above a safe voltage and damages sigma-delta ADC 107 when voltage limiting elements are not used. In various embodiments, any type of voltage limiting element may be used in order to limit measurement voltage VM to a safe voltage.

For example, sigma-delta ADC 107 may have a safe operating voltage limit of 3 V. In such a case, the voltage limiting element may be selected to limit measurement voltage VM to about 2 V. In the embodiment shown, diodes 122a, 122b, 122c, 124a, 124b, and 124c limit measurement voltage VM in each direction to the sum of forward voltage drops VFD across the three diodes in each direction. In a specific embodiment, each of diodes 122a, 122b, 122c, 124a, 124b, and 124c has a forward voltage drop VFD of 0.7 V causing measurement voltage VM to be limited to 2.1 V in each direction because of the three diodes 122a, 122b, and 122c in the first direction and the three diodes 124a, 124b, and 124c in the second direction. According to other embodiments, any number of diodes, including zero diodes, may be used in either direction. In various embodiments, any type of diode with any forward voltage drop VFD may be used. In one embodiment, Zener diodes are used.

According to one embodiment, switch S2 is an optional component that may be provided as a full DC separation safety element. Switch S2 may be controlled by a separate user override control switch in order to decouple contact measurement circuit 101e from switch S1 and voltage source 126. For example, in an automobile when a mechanic or technician is performing maintenance on portions of the system, it may be possible to use switch S2 as a safety override switch and decouple voltage source 126 from circuit portions being contacted by the mechanic or technician and, thereby, reduce the risk of electrocution.

Figure 7A:
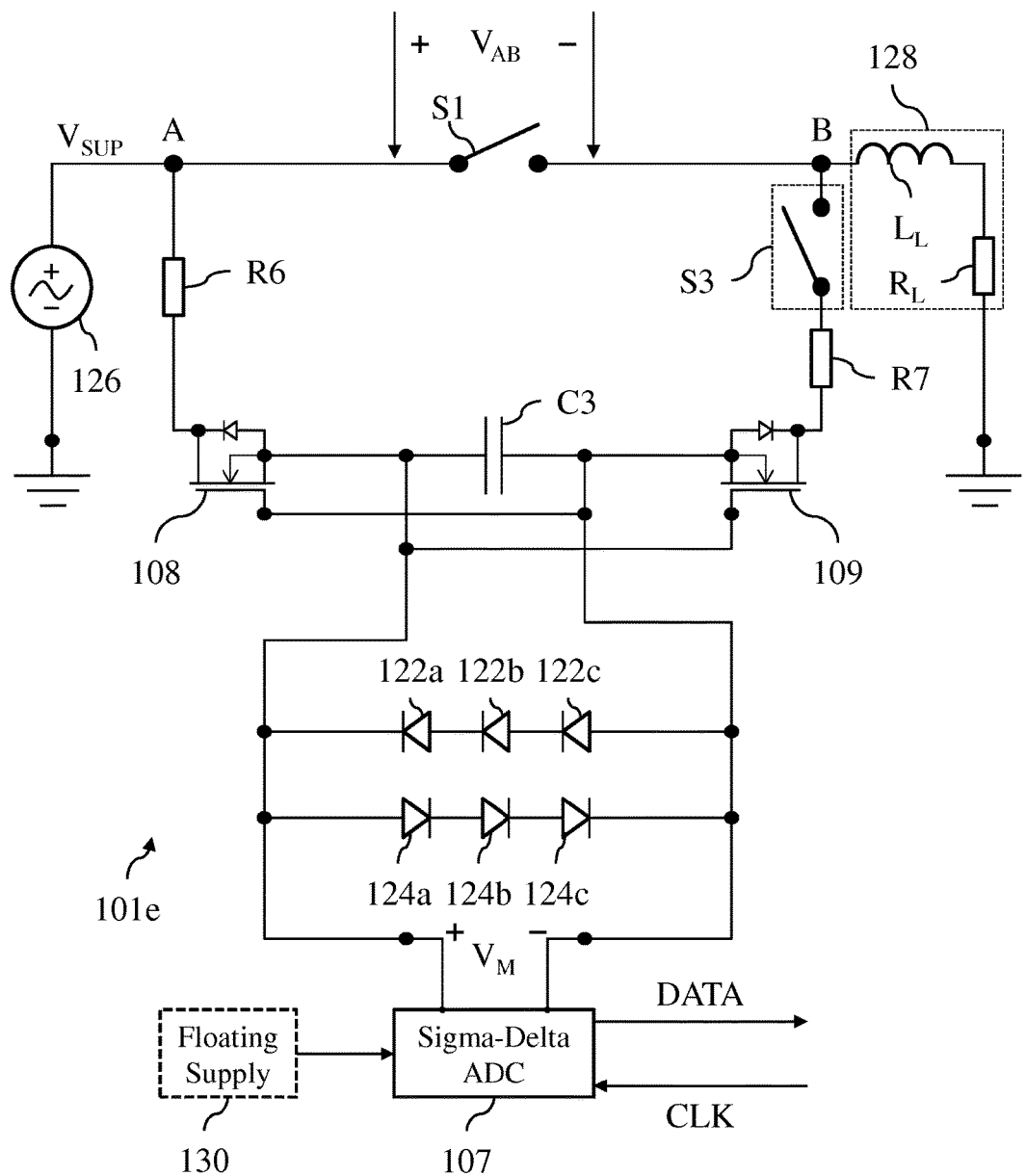
FIG. 7a illustrates a schematic of a further embodiment contact measurement circuit.
Figure 7B:
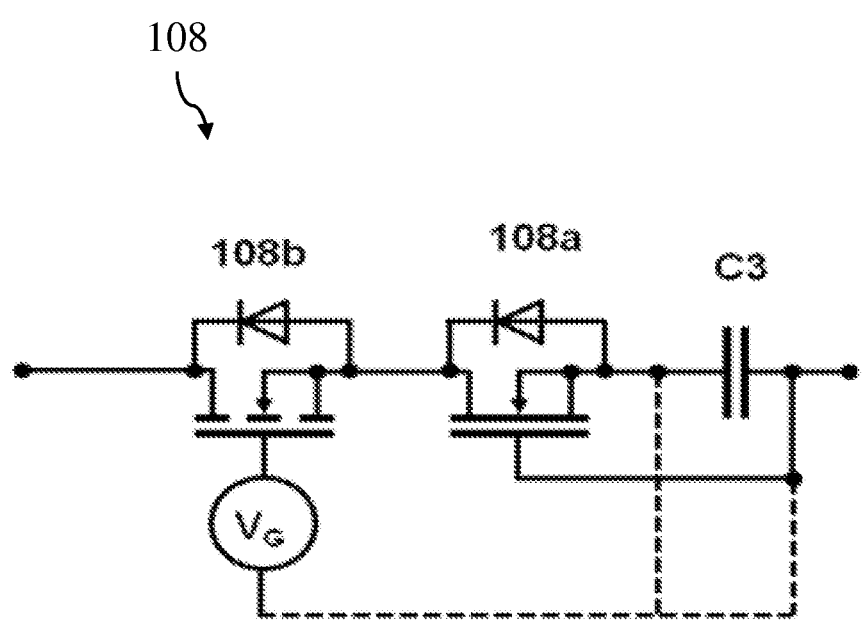
FIG. 7b illustrates a schematic of an embodiment transistor implementation for an embodiment contact measurement circuit.

FIG. 7b illustrates a schematic of an embodiment transistor implementation for an embodiment contact measurement circuit. In such embodiments, transistor 108 or transistor 109 may be implemented as a series connection of two or more individual transistors. In some embodiments, series connected transistors may increase the blocking capability of the resulting chain. As illustrated in FIG. 7b, a cascode circuit including transistors 108a and 108b may be used to implement transistor 108 as described in reference to FIG. 7a. An additional gate supply VG is implemented for transistor 108b. In various embodiments, gate supply VG may be referenced to a single one of the poles of C3, as indicated by the dashed lines, or to a reference potential or ground of voltage measurement unit 106 or the ADC 107, respectively. In some embodiments, a cascode circuit as shown in FIG. 7b may enable a high blocking capability of the transistor 108b combined with a high threshold sensitivity of transistor 108a. Thus, in some specific embodiments, transistor 108a may include a blocking capability only slightly higher than the gate supply of transistor 108b. In other alternative embodiments, a conventional series connection of transistors with adjusted gate control may be used. FIG. 7b shows an implementation for transistor 108, but the same approach may be applied to transistor 109 as well.

Figure 8:
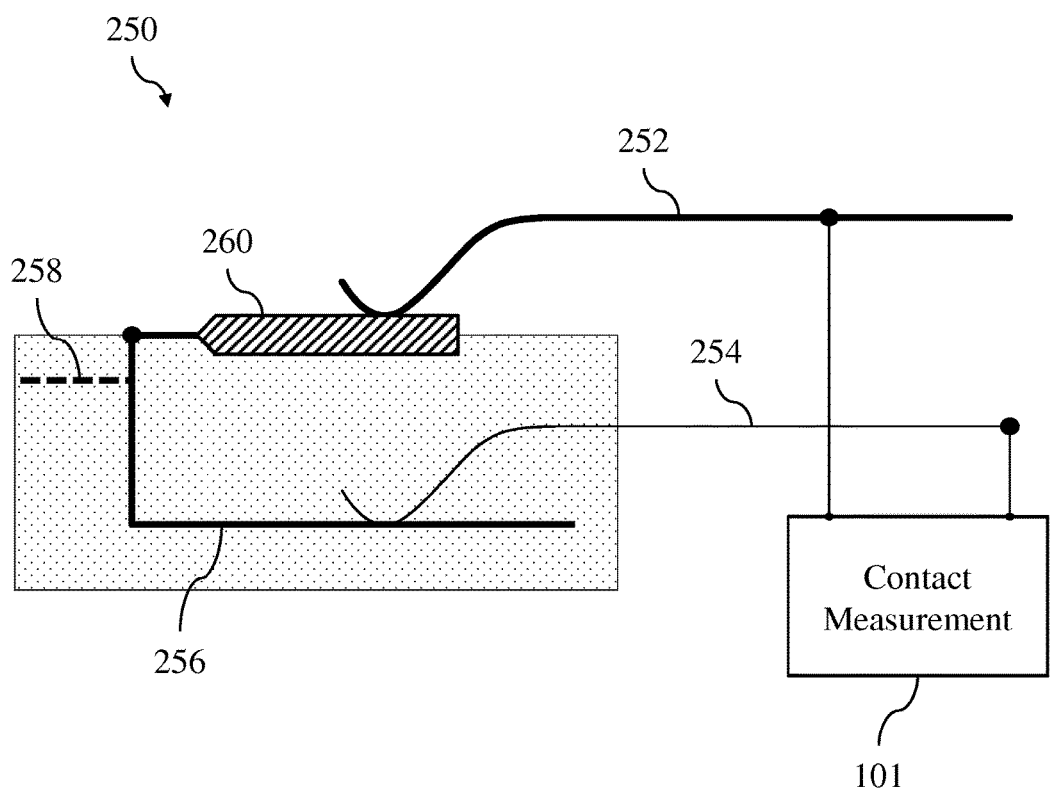
FIG. 8 illustrates a schematic of another embodiment contact measurement system.

FIG. 8 illustrates a schematic of another embodiment contact measurement system 250 including contact measurement circuit 101 as described herein above in reference to the other figures. According to various embodiments, contact measurement circuit 101 is coupled between load contact 252 and a measurement contact 254. Load contact 252 may be a circuit probe or bonding wire for attaching to contact pad 260 on a semiconductor die or printed circuit board (PCB), for example. Measurement contact 254 is also coupled to contact pad 260 through measurement interface 256. In various embodiments, measurement interface 256 may be a second point on contact pad 260 or metallization to a second contact pad. According to various embodiments, contact measurement circuit 101 functions as described above in order to measure the contact resistance between load contact 252 and contact pad 260. Contact pad 260 may be coupled to circuit elements (not shown) through metallization 258. In various embodiments, load contact 252 and measurement contact 254 may be fixed contacts such as, e.g., bond wires or soldering/welding joints, or may be detachable contacts such as, e.g., springs or connectors.

In one embodiment, load contact pad 260 represents the mechanical connection of a plug. Measurement contact or interface 256 may be smaller than load contact 260, because it may conduct smaller currents during operation. Measurement contact 256 is used as voltage feedback. The state where the contacts 252 and 254 are "unplugged," i.e., not connected, corresponds to an open switch S1 in other embodiments as shown in the other figures.

Figure 9C:
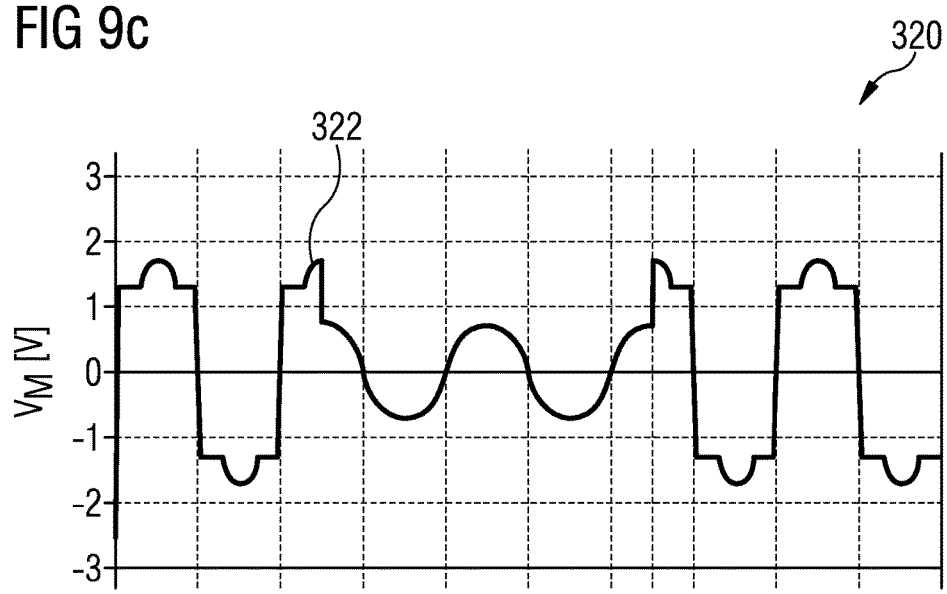

FIGS. 9a, 9b, 9c, 9d, 9e, and 9f illustrate current and voltage waveform diagrams of simulated embodiment measurement circuits in operation. Waveform diagram 300 in FIG. 9a illustrates three plots 302, 304, and 306 of measurement voltage VM across control capacitor C3 while switch S1 is opened and closed for simulated contact resistances of 1 mΩ in plot 302, 10 mΩ in plot 304, and 100 mΩ in plot 306 for switch S1. In the central portion of waveform diagram 300, switch S1 is closed and conducts an alternating current (AC) signal. In such embodiments, measurement voltage VM across control capacitor C3 tracks the AC signal and measurement voltage VM is proportional to the simulated contact resistance. In the other portions of waveform diagram 300, when measurement voltage VM is limited to about +/−1.5 V, switch S1 is opened and voltage drop VAB (not shown) is blocking the full supply voltage.

Waveform diagram 310 in FIG. 9b illustrates plot 312 showing the current through switch S1 according to the same time scale as waveform diagram 300 for all three contact resistances in plots 302, 304, and 306. In this case, the contact resistance may cause a negligible change in the current value, so all three plots are roughly overlaid as one plot 312 in waveform diagram 310. Waveform diagrams 300 and 310 illustrate the switching of switch S1 at zero current.

Figure 9D:
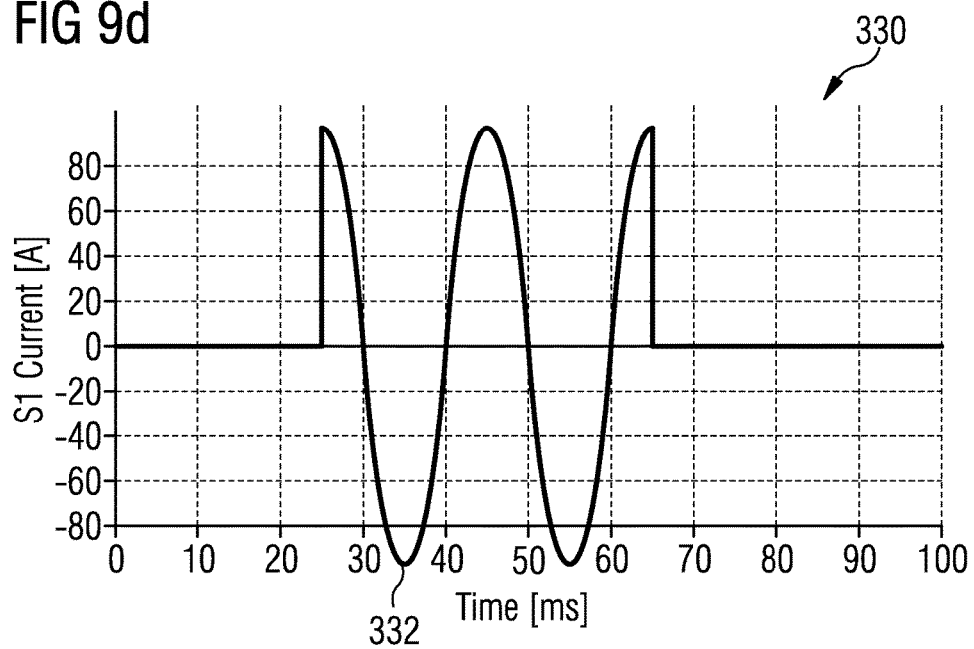

Similar to waveform diagrams 300 and 310, waveform diagram 320 in FIG. 9c illustrates plot 322 of measurement voltage VM across control capacitor C3 while switch S1 is opened and closed and waveform 330 in FIG. 9d illustrates plot 332 showing the current through switch S1 according to the same time scale as waveform diagram 320. Waveform diagrams 320 and 330 illustrate the switching of switch S1 at non-zero current with a peak current flowing through switch S1 at closing of switch S1 and a peak overvoltage at opening of switch S1. Such operation may cause arcing in a mechanical relay if performed with high voltages. As illustrated in FIGS. 9c and 9d, embodiment measurement circuits still track voltage drop VAB when switch S1 is closed and provide self-adapting voltage limiting for the measurement circuit when switch S1 is opened. Accordingly, in the central portion of waveform diagram 320, switch S1 is closed and conducts an AC signal. In such embodiments, measurement voltage VM across control capacitor C3 tracks the AC signal and measurement voltage VM is proportional to the simulated contact resistance. In the other portions of waveform diagram 320, when measurement voltage VM is limited around +/−1.5 V, switch S1 is opened and voltage drop VAB (not shown) is blocking the full supply voltage. Waveform diagram 330 in FIG. 9d illustrates plot 332 of the current flowing through switch S1, which is closed at a peak input signal and opened at a peak input signal.

Waveform diagram 340 in FIG. 9e and waveform diagram 350 in FIG. 9f illustrate plots of measurement voltage VM across control capacitor C3 (waveform diagram 340) and current through switch S1 (waveform diagram 350) while switch S1 is opened and closed for different simulated values of control capacitor C3 and series resistance RSIM (such as resistor R5 or the sum of R6 and R7 as shown in FIGS. 4, 5, and 7 for example) in series with control capacitor C3. Waveform diagram 340 demonstrates that the different RC time constant formed by control capacitor C3 and series resistance RSIM provide similar behavior at the plotted resolution as the plots are nearly overlaid. Waveform diagram 350 illustrates a zoomed in view near point 342 with a much higher resolution that demonstrates the influence of the different RC time constants used for plots 352, 354, 356, and 358. According to this simulation, plot 352 illustrates C3=100 pF and RSIM=470 kΩ, plot 354 illustrates C3=470 pF and RSIM=470 kΩ, plot 356 illustrates C3=470 pF and RSIM=1 MΩ, and plot 358 illustrates C3=1 nF and RSIM=1 MΩ. According to various embodiments, the RC time constant may be adjusted to provide different filtering effects.

In reference to FIGS. 9a-9f, the voltage and current values are illustrative embodiments and other values are envisioned in other embodiments.

Figure 10:
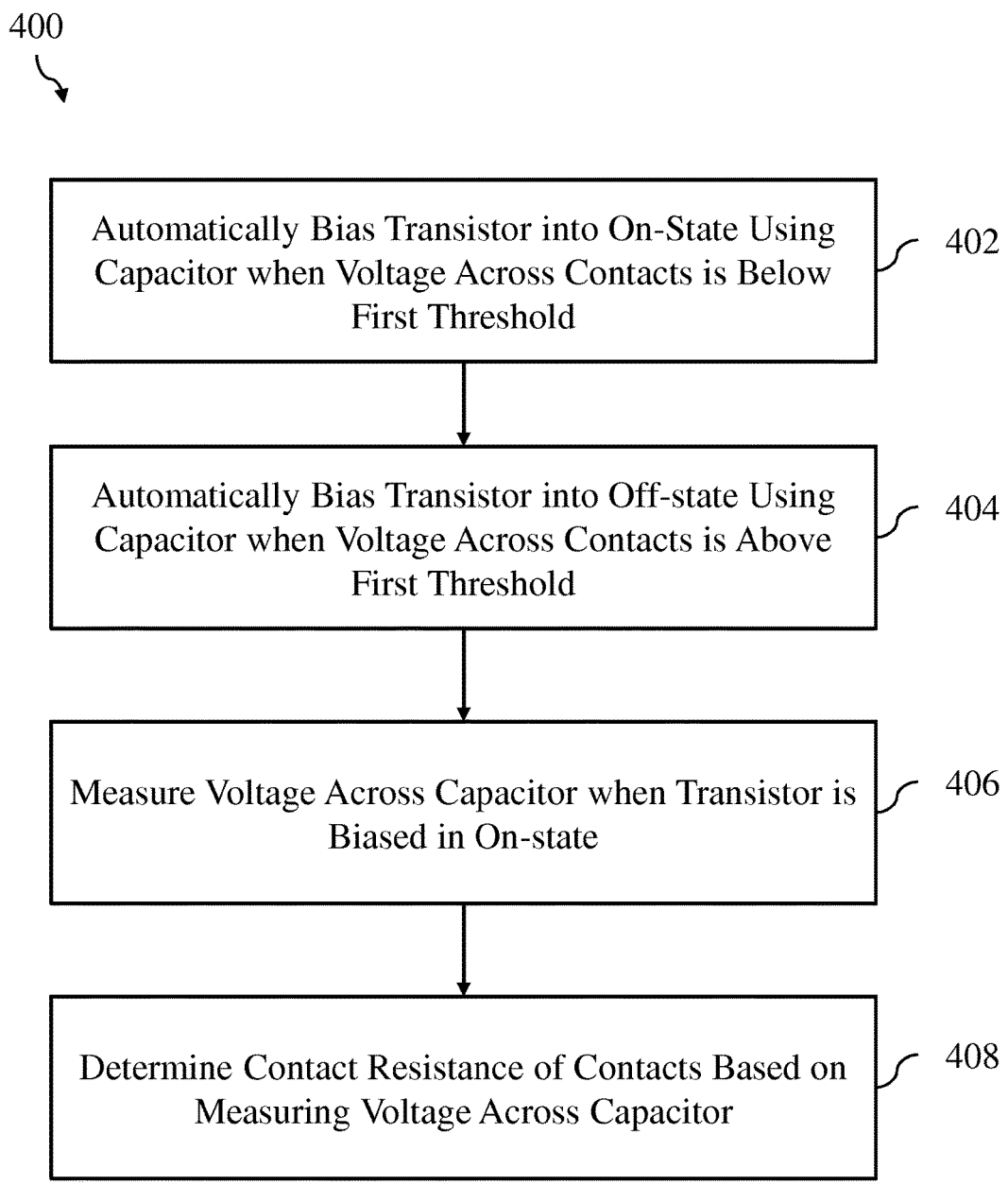
FIG. 10 illustrates a block diagram of an embodiment method of measuring contacts.

FIG. 10 illustrates a block diagram of an embodiment method of measuring contacts 400 including steps 402-408. According to various embodiments, method 400 is a method of measuring contact resistance of contacts using series connected elements including a transistor and a capacitor coupled in series between the contacts. In various embodiments, method 400 may be implemented with any of the contact measurement circuits described herein. The contacts may be for a mechanical relay, for example. In an embodiment, step 402 includes automatically biasing the transistor into an on-state, or a conducting state, using the capacitor when a voltage across the contacts is below a first threshold. The capacitor may be referred to as a control capacitor that forms a series path with the transistor between the contacts and also may have a short circuit connection from a capacitor terminal not connected to a conduction terminal of the transistor to a control terminal of the transistor. The first threshold may be set by the threshold voltage of the transistor.

Following step 402, step 404 includes automatically biasing the transistor into an off-state using the capacitor when the voltage across the contacts is above the first threshold. In both steps 402 and 404, automatically biasing the transistor may include adjusting the voltage on the capacitor and applying the voltage on the capacitor across the control terminal and a conduction terminal of the transistor. In some embodiments, the transistor is a depletion FET and the voltage is applied from the capacitor as the gate-source voltage VGS of the transistor. In such embodiments, the voltage across the capacitor is adjusted proportionally to the voltage across the contacts until reaching a threshold voltage that biases the gate and source of the depletion FET into an off-state. In various embodiments, step 406 follows step 404 and includes measuring a voltage across the capacitor when the transistor is biased in the on-state. Step 408 includes determining a contact resistance of the contacts based on measuring the voltage across the capacitor in some embodiments. In some embodiments, the current may be measured separately in another portion of the circuit. Based on the voltage measurement and the current, the resistance may be determined.

According to various embodiments, high voltages may refer to any time an applied voltage is above the voltage tolerance of a measurement circuit such as contact measurement circuit 101, voltage measurement circuit 106, or an ADC (such as sigma-delta ADC 107), for example. For example, a 10 V supply coupled to a measurement circuit with a 3 V maximum voltage tolerance may trigger embodiment circuits to protect the measurement circuit from the high voltage 100 V signal. In other embodiments, a high voltage signal may be any voltage above 100 V.

According to an embodiment, a contact measurement circuit is configured to be coupled between a first contact and a second contact, and the contact measurement circuit includes a first transistor, a control capacitor, and a voltage measurement unit. The first transistor includes a first conduction terminal configured to be coupled to the first contact, a second conduction terminal, and a first control terminal. The control capacitor includes a first capacitor terminal coupled to the second conduction terminal and a second capacitor terminal coupled to the first control terminal. The voltage measurement unit is coupled to the first capacitor terminal and the second capacitor terminal, and the second capacitor terminal is configured to be coupled to the second contact.

In various embodiments, the contact measurement circuit also includes a first impedance device coupled to the first conduction terminal and configured to be coupled between the first conduction terminal and the first contact. In some embodiments, the contact measurement circuit includes a voltage limiting device coupled between the first capacitor terminal and the second capacitor terminal. The voltage limiting device may be configured to limit the voltage between the first capacitor terminal and the second capacitor terminal to a first threshold voltage. The voltage measurement unit may be a sigma-delta analog to digital converter (ADC). In some embodiments, the first transistor is a normally-on transistor. The first transistor may be a high voltage depletion-mode transistor in an embodiment.

In various embodiments, the contact measurement circuit includes a second transistor with a third conduction terminal coupled to the second capacitor terminal, a fourth conduction terminal, and a second control terminal coupled to the first capacitor terminal. In such embodiments, the fourth conduction terminal is configured to be coupled to the second contact. In some embodiments, the contact measurement circuit also includes a first impedance device coupled to the first conduction terminal and configured to be coupled between the first conduction terminal and the first contact, and a second impedance device coupled to the fourth conduction terminal and configured to be coupled between the fourth conduction terminal and the second contact. The contact measurement circuit may also include a voltage limiting device coupled between the first capacitor terminal and the second capacitor terminal. In such embodiments, the voltage limiting device is configured to limit the voltage between the first capacitor terminal and the second capacitor terminal to a first threshold voltage. The voltage limiting device may include a first plurality of series connected diodes configured to conduct a current from the first capacitor terminal to the second capacitor terminal when the voltage from the first capacitor terminal to the second capacitor terminal is above the first threshold. The voltage limiting device may also include a second plurality of series connected diodes configured to conduct a current from the second capacitor terminal to the first capacitor terminal when the voltage from the second capacitor terminal to the first capacitor terminal is above the first threshold.

According to various embodiments, a method of measuring contact resistance of contacts using series connected elements between the contacts includes a number of steps. The series connected elements include a transistor and a capacitor coupled in series. The method includes automatically biasing the transistor into an on-state using the capacitor when a voltage across the contacts is below a first threshold, automatically biasing the transistor into an off-state using the capacitor when a voltage across the contacts is above the first threshold, measuring a voltage across the capacitor when the transistor is biased in the on-state, and determining a contact resistance of the contacts based on measuring the voltage across the capacitor.

In various embodiments, automatically biasing the transistor includes biasing a control terminal of the transistor using the capacitor without receiving any control signals from an additional control circuit. In some embodiments, the transistor is a high voltage depletion device. The first threshold may be equal to a gate-source threshold voltage of the high voltage depletion device. The method may also include limiting a voltage across the capacitor to a second threshold using a voltage limiting element.

According to various embodiments, a contact measurement circuit includes a first terminal, a second terminal, an isolation circuit coupled to the first terminal and the second terminal, and a measurement unit coupled to the first measurement terminal and the second measurement terminal. The first terminal and the second terminal are configured to be coupled across contacts of a conduction device. In such embodiments, the isolation circuit includes a first measurement terminal and a second measurement terminal, and the isolation circuit is configured to monitor a terminal voltage between the first terminal and the second terminal, block a signal path between the first terminal and the second terminal based on monitoring the terminal voltage, and limit a measurement voltage between the first measurement terminal and the second measurement terminal to the first threshold when the signal path is blocked. The signal path is blocked when the terminal voltage is above a first threshold.

In various embodiments, the isolation circuit includes a first transistor having a first control terminal and having a first conduction path between the first terminal and the second terminal. The isolation circuit also includes an automatic control circuit coupled to the second terminal and the first control terminal. In particular embodiments, the automatic control circuit is only non-switching impedance elements. In some embodiments, the automatic control circuit is configured to automatically control the first transistor without receiving control signals. The automatic control circuit may include a capacitor coupled in series with the first conduction path. In such embodiments, the capacitor has a first capacitor terminal and a second capacitor terminal. The first capacitor terminal is coupled to the first measurement terminal and the second capacitor terminal is coupled to the first control terminal and the second measurement terminal.

In various embodiments, the isolation circuit also includes a second transistor having a second control terminal coupled to the first capacitor terminal and having a second conduction path coupled between the second capacitor terminal and the second terminal. In some embodiments, the automatic control circuit further includes a first diode coupled between the first capacitor terminal and the second capacitor terminal and a second diode coupled between the first capacitor terminal and the second capacitor terminal. The first diode has a first conduction direction and the second diode has a second conduction direction, opposite the first conduction direction. In an embodiment, the first diode includes a plurality of series connected diodes and the second diode includes a plurality of series connected diodes.

In various embodiments, the automatic control circuit also includes a voltage limiting element coupled between the first capacitor terminal and the second capacitor terminal. The voltage limiting element is configured to conduct current in a first conduction direction when a voltage applied to the voltage limiting element goes above a conduction threshold. In some embodiments, the first transistor is a high voltage depletion transistor. The first threshold may be equal to a threshold voltage of the first transistor.

In various embodiments, the contact measurement circuit also includes the conduction device and the conduction device is a relay. In some embodiments, the contact measurement circuit also includes the conduction device and the conduction device is a fuse, an electric switch, or a plug contact.

An advantage of various embodiments described herein may include smaller contacts in certain applications, such as for mechanical relays, leading to reduced cost. Another advantage may include increased safety as resistance is monitored and an error signal is generated when contact resistance rise above a threshold level. An additional advantage may include embodiments that are automatically self-protecting in order to measure contact resistance and switch to a blocking state automatically without intervention from external control signals or logic control circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A contact measurement circuit configured to be coupled between a first contact and a second contact, the contact measurement circuit comprising:
   a first transistor comprising a first conduction terminal configured to be coupled to the first contact, a second conduction terminal, and a first control terminal;
   a control capacitor disposed in series with a conduction path of the first transistor and between the second conduction terminal and the second contact, the control capacitor comprising a first capacitor terminal coupled to the second conduction terminal and a second capacitor terminal coupled directly to the first control terminal to form a circuit path directly from the second capacitor terminal to the first control terminal such that a voltage at the second capacitor terminal is provided directly to the first control terminal, wherein the second capacitor terminal is configured to be coupled to the second contact; and
   a voltage measurement unit coupled to the first capacitor terminal and the second capacitor terminal.

2. The contact measurement circuit of claim 1, further comprising a first impedance device coupled to the first conduction terminal and configured to be coupled between the first conduction terminal and the first contact.

3. The contact measurement circuit of claim 1, further comprising a voltage limiting device coupled between the first capacitor terminal and the second capacitor terminal, the voltage limiting device configured to limit the voltage between the first capacitor terminal and the second capacitor terminal to a first threshold voltage.

4. The contact measurement circuit of claim 1, wherein the voltage measurement unit comprises a sigma-delta analog to digital converter (ADC).

5. The contact measurement circuit of claim 1, wherein the first transistor comprises a normally-on transistor.

6. The contact measurement circuit of claim 5, wherein the first transistor comprises a high voltage depletion-mode transistor.

7. The contact measurement circuit of claim 1, further comprising a second transistor comprising a third conduction terminal coupled to the second capacitor terminal, a fourth conduction terminal, and a second control terminal coupled to the first capacitor terminal, wherein the fourth conduction terminal is configured to be coupled to the second contact.

8. The contact measurement circuit of claim 7, further comprising:
   a first impedance device coupled to the first conduction terminal and configured to be coupled between the first conduction terminal and the first contact, and
   a second impedance device coupled to the fourth conduction terminal and configured to be coupled between the fourth conduction terminal and the second contact.

9. The contact measurement circuit of claim 7, further comprising a voltage limiting device coupled between the first capacitor terminal and the second capacitor terminal, the voltage limiting device configured to limit the voltage between the first capacitor terminal and the second capacitor terminal to a first threshold voltage.

10. The contact measurement circuit of claim 9, wherein the voltage limiting device comprises:
    a first plurality of series connected diodes configured to conduct a current from the first capacitor terminal to the second capacitor terminal when the voltage from the first capacitor terminal to the second capacitor terminal is above the first threshold voltage, and
    a second plurality of series connected diodes configured to conduct a current from the second capacitor terminal to the first capacitor terminal when the voltage from the second capacitor terminal to the first capacitor terminal is above the first threshold voltage.

11. A method of measuring contact resistance of contacts using series connected elements between the contacts, the series connected elements comprising a transistor having a conduction path and a capacitor coupled in series with the conduction path of the transistor, the method comprising:
    automatically biasing the transistor into an on-state using a control voltage provided directly to the transistor by the capacitor when a voltage across the contacts is below a first threshold;
    automatically biasing the transistor into an off-state using the control voltage provided directly to the transistor by the capacitor when a voltage across the contacts is above the first threshold;
    measuring a voltage across the capacitor when the transistor is biased in the on-stat, wherein the voltage is created by current flow through the conduction path to the capacitor; and
    determining a contact resistance of the contacts based on measuring the voltage across the capacitor.

12. The method of claim 11, wherein automatically biasing the transistor comprises biasing a control terminal of the transistor using the capacitor without receiving any control signals from an additional control circuit.

13. The method of claim 11, wherein the transistor comprises a high voltage depletion device.

14. The method of claim 13, wherein the first threshold is equal to a gate-source threshold voltage of the high voltage depletion device.

15. The method of claim 11, further comprising limiting a voltage across the capacitor to a second threshold using a voltage limiting element.

16. A contact measurement circuit comprising:
    a first terminal;
    a second terminal, wherein the first terminal and the second terminal are configured to be coupled across contacts of a conduction device;
    a isolation circuit coupled to the first terminal and the second terminal, the isolation circuit comprising a first measurement terminal and a second measurement terminal, wherein the isolation circuit is configured to:
        monitor a terminal voltage between the first terminal and the second terminal,
        block a signal path between the first terminal and the second terminal based on monitoring the terminal voltage, wherein the signal path is blocked when the terminal voltage is above a first threshold, and limit a measurement voltage between the first measurement terminal and the second measurement terminal to the first threshold when the signal path is blocked; and a measurement unit coupled to the first measurement terminal and the second measurement terminal.

17. The contact measurement circuit of claim 16, wherein the isolation circuit comprises:

a first transistor comprising a first control terminal and having a first conduction path between the first terminal and the second terminal; and an automatic control circuit coupled to the second terminal and the first control terminal.

18. The contact measurement circuit of claim 17, wherein the automatic control circuit consists of non-switching impedance elements.

19. The contact measurement circuit of claim 17, wherein the automatic control circuit is configured to automatically control the first transistor without receiving control signals.

20. The contact measurement circuit of claim 17, wherein the automatic control circuit comprises a capacitor coupled in series with the first conduction path, wherein the capacitor comprises a first capacitor terminal and a second capacitor terminal, wherein the first capacitor terminal is coupled to the first measurement terminal, and wherein the second capacitor terminal is coupled to the first control terminal and the second measurement terminal.

21. The contact measurement circuit of claim 20, wherein the isolation circuit further comprises a second transistor comprising a second control terminal coupled to the first capacitor terminal and having a second conduction path coupled between the second capacitor terminal and the second terminal.

22. The contact measurement circuit of claim 21, wherein the automatic control circuit further comprises:

a first diode coupled between the first capacitor terminal and the second capacitor terminal, the first diode having a first conduction direction; and a second diode coupled between the first capacitor terminal and the second capacitor terminal, the second diode having a second conduction direction, opposite the first conduction direction.

23. The contact measurement circuit of claim 22, wherein the first diode comprises a plurality of series connected diodes and the second diode comprises a plurality of series connected diodes.

24. The contact measurement circuit of claim 20, wherein the automatic control circuit further comprises a voltage limiting element coupled between the first capacitor terminal and the second capacitor terminal, the voltage limiting element configured to conduct current in a first conduction direction when a voltage applied to the voltage limiting element goes above a conduction threshold.

25. The contact measurement circuit of claim 17, wherein the first transistor comprises a high voltage depletion transistor.

26. The contact measurement circuit of claim 17, wherein the first threshold is equal to a threshold voltage of the first transistor.

27. The contact measurement circuit of claim 16, further comprising the conduction device and wherein the conduction device comprises a relay.

28. The contact measurement circuit of claim 16, further comprising the conduction device and wherein the conduction device comprises a fuse, an electric switch, or a plug contact.

29. The contact measurement circuit of claim 1, wherein the first capacitor terminal is coupled directly to the second conduction terminal.

30. The contact measurement circuit of claim 1, wherein the contact measurement circuit is free of voltage limiting elements in parallel with the control capacitor.

* * * * *